United States Patent

Petranovich et al.

[11] Patent Number: 5,757,864
[45] Date of Patent: May 26, 1998

[54] RECEIVER WITH FILTERS OFFSET CORRECTION

[75] Inventors: James E. Petranovich, Encinitas, Calif.; Joseph T. Lipowski, Boxborough, Mass.

[73] Assignee: Rockwell Semiconductor Systems, Inc., Newport Beach, Calif.

[21] Appl. No.: 516,197

[22] Filed: Aug. 17, 1995

[51] Int. Cl.[6] .................................................. H04L 27/06
[52] U.S. Cl. ........................ 375/344; 455/196.1; 455/264
[58] Field of Search ........................... 375/254, 316, 375/350, 344, 375; 455/196.1, 197.1, 264, 265, 296, 306; 331/1 R

[56] References Cited

U.S. PATENT DOCUMENTS

| | | | |
|---|---|---|---|
| 3,657,661 | 4/1972 | Jarger | 329/122 |
| 4,078,212 | 3/1978 | Rast | 325/421 |
| 4,237,556 | 12/1980 | Naito | 455/196.1 |
| 4,466,128 | 8/1984 | Couvillon | 455/208 |
| 4,528,698 | 7/1985 | Fraser | 455/319 |
| 4,599,732 | 7/1986 | Lefever | 375/112 |
| 4,903,332 | 2/1990 | Hansen | 455/209 |
| 5,012,490 | 4/1991 | Myer | 375/58 |
| 5,065,453 | 11/1991 | Thomas | 455/286 |
| 5,101,509 | 3/1992 | Lai | 455/183 |
| 5,222,106 | 6/1993 | Satoh et al. | 375/102 |
| 5,404,589 | 4/1995 | Bijker et al. | 455/200.1 |
| 5,418,815 | 5/1995 | Ishikawa et al. | 375/344 |
| 5,487,186 | 1/1996 | Scarpa | 375/344 |

OTHER PUBLICATIONS

Panter, Philip F., Ph.D., *Modulation, Noise, And Spectral Analysis*, 1965, McGraw–Hill Book Company, Chap. 16, Threshold Extension in Frequency Modulation Receivers, pp. 478–483.

*Primary Examiner*—Wellington Chin
*Assistant Examiner*—Congvan Tran
*Attorney, Agent, or Firm*—William C. Cray; Susie H. Oh

[57] ABSTRACT

The present invention relates to circuitry for a receiver having a low cost filter using automatic alignment of the center frequency of signals input to the filter to suppress noise and out-of-band signals from the filter output over a narrow bandwidth. An RF input signal to the receiver is downconverted to an IF frequency using a VCO, and the IF signal is provided to the low cost filter. The output of the filter is input to a frequency correction circuit and a distortion detection circuit. The distortion detection circuit provides an error signal including positive frequency shift errors determined from digital ones identified from the filter output signal, and negative frequency shift error signals determined from digital zeros in the filter output signal. The distortion detection circuit output is then provided through an infinite impulse response filter which integrates the distortion detection output to provide a voltage control signal to a voltage control input of the VCO and the frequency correction circuit. The VCO then automatically centers the frequency of the signal input to the low cost filter to suppress noise and out-of-band signals, and the frequency correction circuit removes error correction frequency shift provided by the VCO after downconversion. For battery powered devices, the infinite impulse response filter can maintain the state of the voltage control signal provided to the VCO upon receipt of a sleep mode signal after the sleep mode signal is disabled.

23 Claims, 3 Drawing Sheets

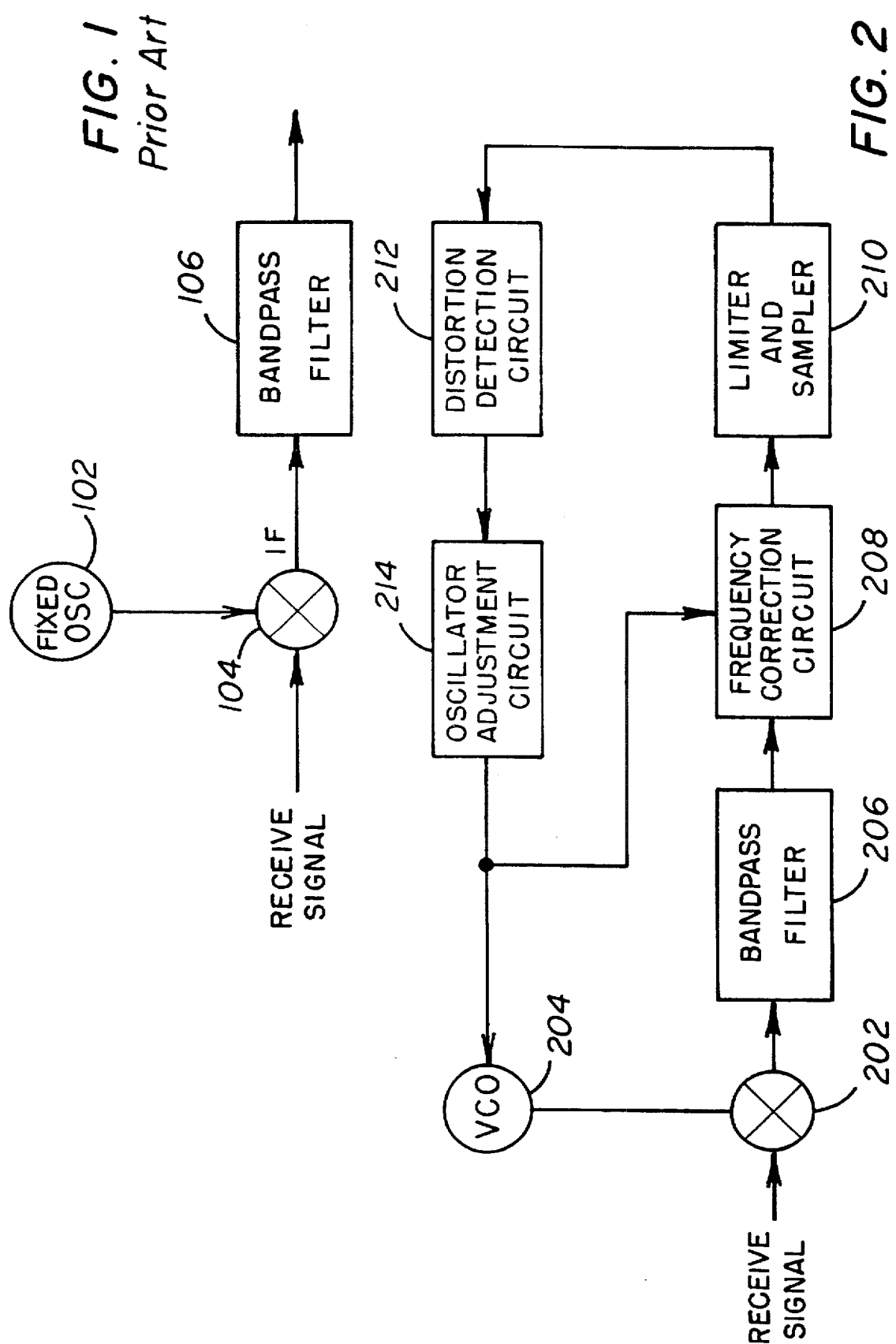

RECEIVER WITH FILTERS OFFSET CORRECTION

BACKGROUND OF THE INVENTION

1. Field of the Invention

The present invention relates to a radio receiver design that provides noise suppression and elimination of out-of-band signals in the output from the radio receiver. More particularly, the invention relates to a method and apparatus for automatically aligning the center frequency of signals input to a bandpass filter in a radio receiver that improves noise suppression and eliminates out-of-band signals over a narrow bandwidth.

2. Description of the Related Art

Communications systems generally include a broadcast station from which a signal is broadcast at a particular frequency and one or more receivers that can be tuned to receive the broadcast signal. The broadcast signal often picks up a variety of noise and stray signals that mar the reception of the signal at a receiver. Thus, receivers are typically constructed with filters that reduce the noise and out-of-band signals in the broadcast signal when received.

In cellular systems and paging systems, it is particularly important to filter received signals in order to reduce noise and eliminate out-of-band signals. Such filtering enhances the reception of the signal and allows a user of a cellular telephone, for example, to conduct a clear conversation.

Filter performance is critical to receiver performance. However, there is a trade-off between cost of the filters and receiver performance with respect to on-channel performance and off-channel rejection. Ordinarily, maximizing on-channel receiver performance and off-channel rejection translates to the utilization of expensive filters, which, in turn, translates to higher costs to consumers who purchase receivers.

In order to maximize on- channel performance and off channel rejection in a receiver, a manufacturer is required to match the bandwidth of a filter with the bandwidth of a desired input signal. Failure to match or closely correlate the bandwidth of the filter with the bandwidth of a desired signal results in corruption and/or distortion of the signal. For example, where the filter bandwidth is higher than that of the desired input signal, noise and out-of-band signals act to corrupt the desired input signal. Similarly, where the filter bandwidth is lower than the desired input signal, the desired input signal becomes distorted.

FIG. 1 is a schematic diagram that shows a typical prior art receiver design. The design includes a mixer 104, a fixed oscillator 102, and a bandpass filter 106. In the design, a received radio frequency (RF) signal is down converted to an intermediate frequency (IF) signal using a mixer 104 and a fixed local oscillator (LO) 102. The IF signal output from the mixer 104 is processed through the bandpass filter 106. Typical bandpass filters have varying center frequencies. Low cost filters generally exhibit more center frequency variation than do more expensive filters. Typical low cost filters include ceramic filters or crystal filters.

Significant noise and out-of-band signals arise when the receive signal bandwidth is very narrow in comparison to the IF signal bandwidth. For example, the center frequency of a low cost filter can vary by as much as 2 to 4 kHz in each direction. A receive signal that has an IF signal of 455 kHz and a bandwidth of 8 kHz can have its center frequency offset by as much as 4 kHz in one direction by the bandpass filter. In such a situation, one-half of the desired receive signal can be eliminated by the filter.

Conventional approaches are available to enable suppression of noise and out-of-band signals caused by a filter having a varying center frequency. One method, functioning for wide bandwidth FM, is to use a frequency compressive feedback (FCF) technique to create a frequency compressive FM receiver. For the FCF technique, the fixed oscillator 102 of FIG. 1 is replaced by a voltage controlled oscillator, and the output of bandpass filter 106 is fed back through a frequency discriminator to the VCO. Using the FCF technique, the frequency of the received RF signal is compared with the frequency of the LO signal generated by oscillator 102 in the frequency discriminator. The resulting feedback signal from the frequency discriminator, then, enables the LO signal to more closely track the received RF signal while utilizing a relatively narrow bandpass filter 106 to reduce noise and out-of-band signals.

For other modulation types, specific filter requirements have been imposed to further enable suppression of noise and out-of-band signals. One approach that has been tried is to use wider bandwidth low cost filters. However, this approach disadvantageously increases noise and the presence of out-of-band signals. Another approach that has been tried is to carefully select each individual filter to possess characteristics that will assure acceptable frequency errors. However, again, such selection disadvantageously increases filter cost. In addition, such selection is difficult because center frequencies and bandwidths often vary for each filter as a function of temperature. While temperature can theoretically be controlled, the additional design and components required to control the temperature add expense to the receiver design.

Accordingly, it would be desirable to provide an improved receiver design that utilizes low cost bandpass filters yet reduces noise and eliminates out-of-band signals over a narrow bandwidth. It would also be desirable to provide methods to reduce noise and eliminate out-of-band signals in a receiver that utilizes low cost bandpass filters.

SUMMARY OF THE INVENTION

The present invention provides a solution to the above-discussed problems in radio communication receivers. As mentioned, conventional radio receivers must be equipped with relatively high priced bandpass filters in order to ensure acceptable noise levels and to limit out-of-band signals over a narrow bandwidth. The present invention, through provision of relatively simple and inexpensive circuitry, allows the utilization of low cost bandpass filters in conventional receiver designs while providing noise suppression and elimination of out-of-band signals in a received signal over a narrow bandwidth. The invention can further provide the advantage of enhanced operation speed in battery powered devices.

The operation of the present invention is accomplished, essentially, by estimating distortion caused by frequency deviation errors recovered from digital data in an IF signal output from a bandpass filter. The estimated distortion is then fed back to alter the center frequency of an RF input signal to the receiver to account for filter center frequency misalignment. Essentially, a receiver incorporating the present invention acts to automatically match the bandwidth of the received signal with the bandwidth of the bandpass filter.

In operation with battery powered receivers, a sleep mode is typically provided by the receiver wherein components are powered down to conserve battery power. In the present invention, during the sleep mode, the distortion estimate is remembered at a time when the sleep mode is applied. Then, upon power up when the sleep mode is disabled, the remembered distortion estimate is bed back to allow rapid recovery to maximum distortion elimination.

Therefore, as discussed above, the circuit causes the receiver to mimic a receiver that includes expensive bandpass filters or bandpass filters that are carefully matched to the bandwidth of the received signal. By providing a bandpass filter that is closely aligned or matched to the bandwidth of the received signal, noise is suppressed and out-of-band signals are eliminated over a narrow bandwidth range. Further, by being configured to rapidly recover from a sleep mode, the present invention provides enhanced utility in a battery powered device.

The invention thus provides an alternative in receiver design to the use of high cost bandpass filters. The present invention applies to low cost ceramic, crystal and surface acoustic wave (SAW) bandpass filters, although virtually any bandpass filter can be used in the manufacture of a receiver in accordance with the invention. Through use of the apparatus and method of the invention a user can be assured that noise levels and out-of-band signals are limited.

The present inventive receiver includes circuitry that enables the automatic alignment of the center frequency of input signals to the bandpass filter to reduce noise and out-of-band signals output by the bandpass filter. The present invention can further include circuitry to enable rapid recovery from a sleep mode.

Specifically in a preferred embodiment of the present invention, input signals are downconverted to an IF signal using a voltage controlled oscillator (VCO). The IF signal is output to a low cost bandpass filter. The output of the bandpass filter is input to a series connected frequency correction circuit and a distortion detection circuit.

The distortion detection circuit estimates distortion caused by frequency deviation errors recovered from digital data in the signals input to the receiver. The estimated distortion is a function of the sign of the digital data. In one embodiment, the distortion detection circuit provides an error signal including positive frequency shift errors determined from errors in the digital ones in the signal output by the frequency correction circuit and negative frequency shift error signals determined from digital zeros in the signal output by the frequency correction circuit.

The distortion detection circuit is preferably coupled to an infinite impulse response filter that integrates the distortion detection circuit output signals. The output of the infinite impulse response filter provides a voltage control signal to voltage control inputs of the VCO and the frequency correction circuit. The VCO automatically centers the frequency of the input signal of the bandpass filter to suppress noise and out-of-band signals. The voltage control signal from the infinite impulse response filter enables the frequency correction circuit to remove error correction frequency shifting provided by the VCO after downconversion.

Because the infinite impulse response filter is a digital component, it can be configured to enhance operation in battery powered devices. In battery powered devices, a sleep mode is provided to enable components to power down and conserve battery power when no receiver input signal is received. Upon power up after the sleep mode is disabled when a receiver input signal is received, the digital output state of the impulse response filter can be remembered enabling the receiver to rapidly return to a state of maximum distortion elimination.

BRIEF DESCRIPTION OF THE DRAWINGS

Further details of the present invention are explained with the help of the attached drawings in which:

FIG. 1 is a circuit diagram showing a prior art receiver design including a bandpass filter;

FIG. 2 is a schematic block diagram for circuitry of a preferred embodiment of the present invention;

DETAILED DESCRIPTION

Figure 3:
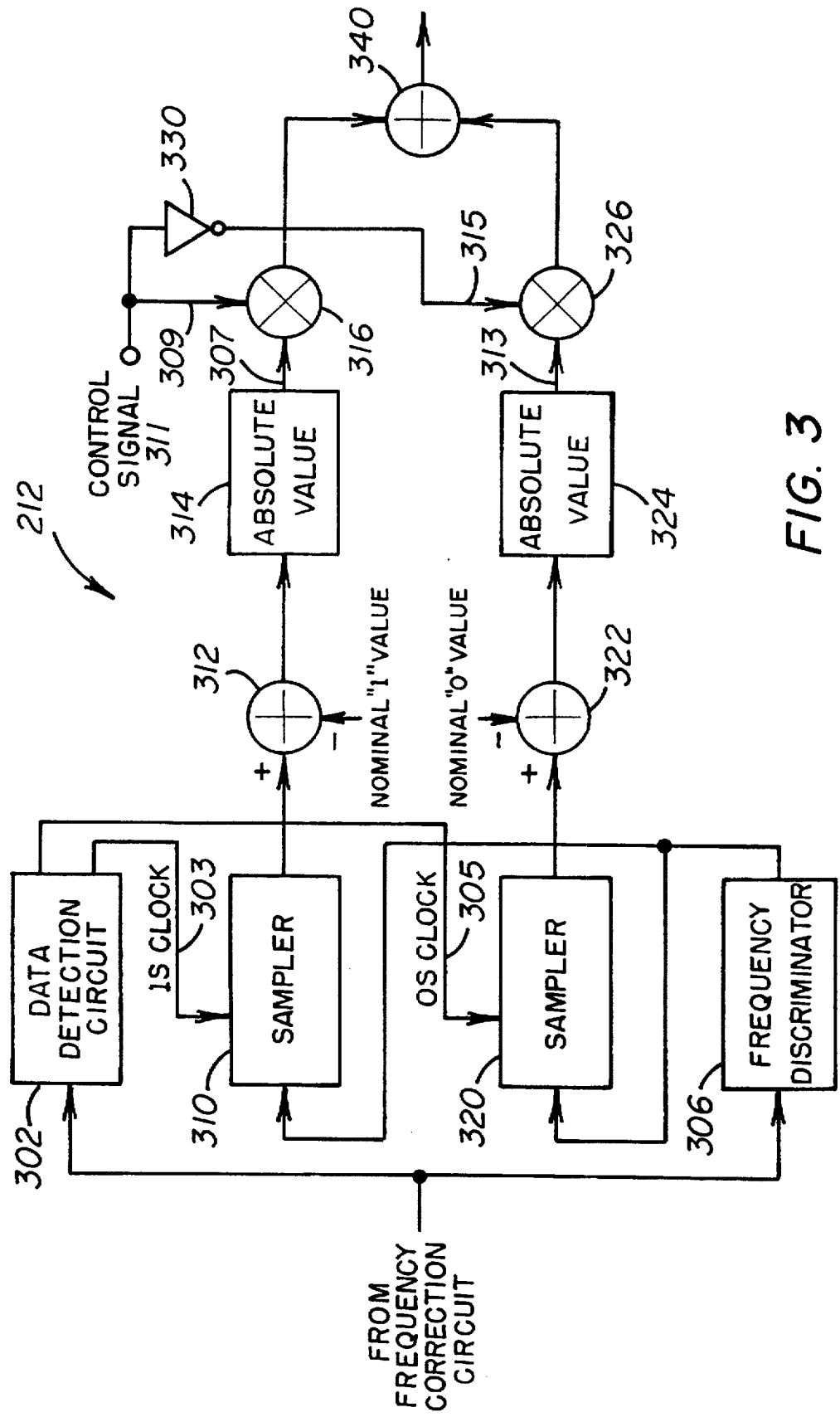
FIG. 3 is a circuit diagram showing a preferred embodiment of the distortion detection circuit shown schematically in FIG. 2.

A schematic block diagram showing a preferred circuit design in accordance with the present invention is provided in FIG. 2. In the circuit, as shown, an RF signal is received by the receiver. The RF signal is downconverted to an IF signal using a mixer 202. Concurrently, the mixer 202 receives a local oscillator (LO) signal from a variable conversion frequency signal element such as a VCO 204. An IF signal is output from the mixer 202 to a bandpass filter 206. The bandpass filter 206 suppresses noise and out-of-band signals from the IF signal. The function and operation of the bandpass filter 206 is similar to that of the bandpass filter 106 of FIG. 1.

The output of the bandpass filter 206 is input to a frequency correction circuit 208. The frequency correction circuit 208 removes frequency offset introduced by error voltage control adjustments, discussed below, to the VCO 204. While a variety of circuits may be used to implement the frequency correction circuit 208, in a preferred embodiment, the frequency correction circuit 208 is implemented using a simple analog or digital servo loop.

As will be appreciated, the output from the frequency correction circuit 208 can be sinusoidal. Such a sinusoidal output is converted to a digital signal and sampled. Conversion to a digital signal and sampling is, in one embodiment, accomplished utilizing a limiter and sampler circuit 210. While sampling in the limiter and sampler circuit 210 can be accomplished utilizing a variety of techniques, in a preferred embodiment, sampling is conducted in a manner designed to provide optimum sampling time. In a preferred embodiment, optimum sampling time is achieved by centering between zero crossings of the signal output by the frequency correction circuit 208.

As mentioned previously, the sinusoidal output from the frequency correction circuit 208 is converted to a digital signal by the limiter and sampler circuit 210. The limiter and sampler circuit 210, in a preferred embodiment, is constructed to allow digital conversion and to achieve optimum sampling time through inclusion of a limiter. A variety of designs will be evident to those of ordinary skill in the art for the implementation of the limiter in the limiter and sampler circuit 210. As mentioned, the limiter preferably acts to determine the zero crossings in the signal and to convert the sinusoidal signal to a digital signal. In a preferred embodiment, these actions are accomplished in the limiter through including a comparator that forms a zero crossing detector and a D-type flip-flop.

The output of the limiter and sampler circuit 210 is input to a distortion detection circuit 212. The distortion detection circuit 212 estimates the degree of distortion in an incoming signal based on an analysis of the digital data recovered from the received signal. If the input signal is modulated using minimum shift keying (MSK) with Gaussian filtering, the distortion can be estimated as a function of the sign of the digital data. Although MSK modulation is preferred, frequency shift keying (FSK) modulation may also be utilized and distortion can also be estimated as a function of the sign of the data. In the embodiment shown in FIG. 2, the distortion detection circuit 212 estimates the distortion from the deviation error recovered from the output of bandpass filter 206. The distortion detection circuit 212 provides a signal including positive frequency shift errors determined from digital ones identified from the bandpass filter output signal and negative frequency shift error values determined from digital zeros identified from the bandpass filter output.

The signal output by the distortion detection circuit 212 is converted to an analog signal by an oscillator adjustment circuit 214 to provide a voltage adjustment signal to the VCO 204 and frequency correction circuit 208. One example of the oscillator adjustment circuit 214 is an infinite impulse response filter. An infinite impulse response filter functions to provide the time integral of the output signal from the distortion detection circuit 212 as the voltage adjustment signal.

It is particularly desirable for the oscillator adjustment circuit 214 to be a digital device, because with a digital device, receiver operation can be improved in battery powered devices. In battery powered devices, digital components can be utilized which enter a sleep mode upon receipt of a sleep mode signal when a receiver input signal is not received for a period of time. When the receiver input signal later changes, the sleep mode signal is disabled and the digital components powered down will then utilize a short time period to power back up. The sleep mode is useful in battery powered devices, such as pagers, because without components being continually powered up, batteries are not constantly drained.

With the oscillator adjustment circuit 214 responding to a sleep mode signal, its voltage control output signal state upon receiving a sleep mode signal can be remembered upon power up when the sleep mode signal is disabled. With the voltage adjustment output of an oscillator adjustment circuit 214 remembered from receipt of the sleep mode signal, the receiver can more rapidly return to a condition of maximum distortion elimination upon power up. Without remembering a previous state, upon power up from a sleep mode, recovery time for the oscillator adjustment circuit to return to a state of maximum distortion elimination is substantially increased. An example of an oscillator adjustment circuit 214 which is a digital component is the infinite impulse response filter referred to above.

FIG. 3 is a circuit diagram showing a preferred design of the distortion detection circuit 212 which is shown schematically in FIG. 2. The distortion detection circuit 212 includes a data detection circuit 302 which receives the output from the sampler and limiter circuit 210. The data detection circuit 302 identifies logical zeros and ones in the incoming signal. The data detection circuit 302 provides a 1's clock output 303 that indicates when logical ones are detected and a 0's clock output 305 that indicates when logical zeros are detected.

The distortion detection circuit 212 further includes a frequency discriminator 306 which receives the output from the sampler and limiter circuit 210. The frequency discriminator 306 compares the frequency of an internal reference signal with the frequency of the RF signal from the frequency correction circuit. The output of the frequency discriminator 306 is provided to samplers 310 and 320 to enable the samplers to provide a digital output word representing a sampled value at a specific time instant as determined by the data detection circuit.

As shown in FIG. 3, the 1's clock output 303 is output to a sampler 310 to enable sampling of the output of the frequency discriminator 306 during receipt of digital ones. The 0's clock output 305 is output to a sampler 320 to enable sampling of the output of the frequency discriminator 306 during receipt of digital zeros.

The output of the sampler 310 is compared with the nominal value for a one in the comparison circuit 312 in order to provide a ones frequency shift error value (a "ones error value"). The absolute value of the ones error value from the comparison circuit 312 is provided by an absolute value circuit 314. Similarly, the output of the sampler 320 is compared with the nominal value for a zero in a comparison circuit 322 in order to provide a zeros frequency shift error value (a "zeros error value"). The absolute value of the zeros error value from the comparison circuit 322 is provided by an absolute value circuit 324.

A multiplier 316 has a first input 307 for receiving the ones frequency shift error value from the absolute value circuit 314, and a second input 309 for receiving a control signal 311. Similarly, a multiplier 326 has a first input 313 for receiving the zeros frequency shift error value from the absolute value circuit 324 and a second input 315 for receiving the inverse of the control signal 311 from an inverter 330. The control signal 311 is preferably provided by a voltage reference. However, other sources for the control signal 311 can be utilized. For example, the combined 1's and 0's clock outputs, 303 and 305, respectively, of the data detection circuit 302 can be utilized as the control signal 311. Outputs of multipliers 316 and 326 are added by an adder 340 to provide an error signal output of the distortion detection circuit 212.

The error signal output of the adder 340 thus contains positive values and/or negative values indicating the magnitude of frequency shift errors for digital ones and/or zeros, respectively, that are identified in the signal output by the filter 206 (FIG. 2). The output of the adder 340 is coupled to the oscillator adjustment circuit 214. The oscillator adjustment circuit integrates the output from the adder 340 and feeds back the integrated output to the VCO 204 and the frequency correction circuit 208. The feed back signal acts to adjust the center frequency of signals input to the filter 206 so that the average distortion for ones and zeros at the filter output is made equal. In this manner, the bandwidth of the received signal is "matched" with the bandwidth of the bandpass filter 206. As discussed above, such "matching" suppresses noise and eliminates out-of-band signals.

As described, estimation of distortion is accomplished in the distortion detection circuit 212 of FIG. 3 through the use of positive values and negative values of the magnitude of frequency shift errors for the digital ones and zeros, respectively. However, as will be appreciated, other means for estimating distortion using recovered digital data can also be utilized. For instance, sign values for frequency shift errors can be reversed, i.e., negative values and positive values corresponding to the magnitudes of frequency shift errors for digital ones and digital zeros, respectively. Also, the negative value corresponding to the magnitude of frequency shift errors for a particular combination of zeros and ones may be used as opposed to positive values corresponding to other combinations of zeros and ones.

It will be understood, therefore, that while FIG. 3 shows specific components for the distortion detection circuit 212, other implementations are possible and contemplated by the present invention. Certainly, a variety of similar and equivalent circuits can be designed and utilized in accordance with the invention. In addition, however, certain software and/or programmable implementations are also contemplated. For example, a digital signal processor (DSP) or microprocessor can be substituted for the distortion detection circuit 212 and programmed to provide a function similar to the circuitry shown in FIG. 3 or equivalent circuits.

The output from the bandpass filter 206, as shown in FIG. 2, is converted to a baseband signal and digitized using the limiter and sampler circuit 210. However, it will be appreciated that a variety of other methods of converting the bandpass filter 206 output to a baseband signal and digitizing the signal can be utilized.

Figure 4:
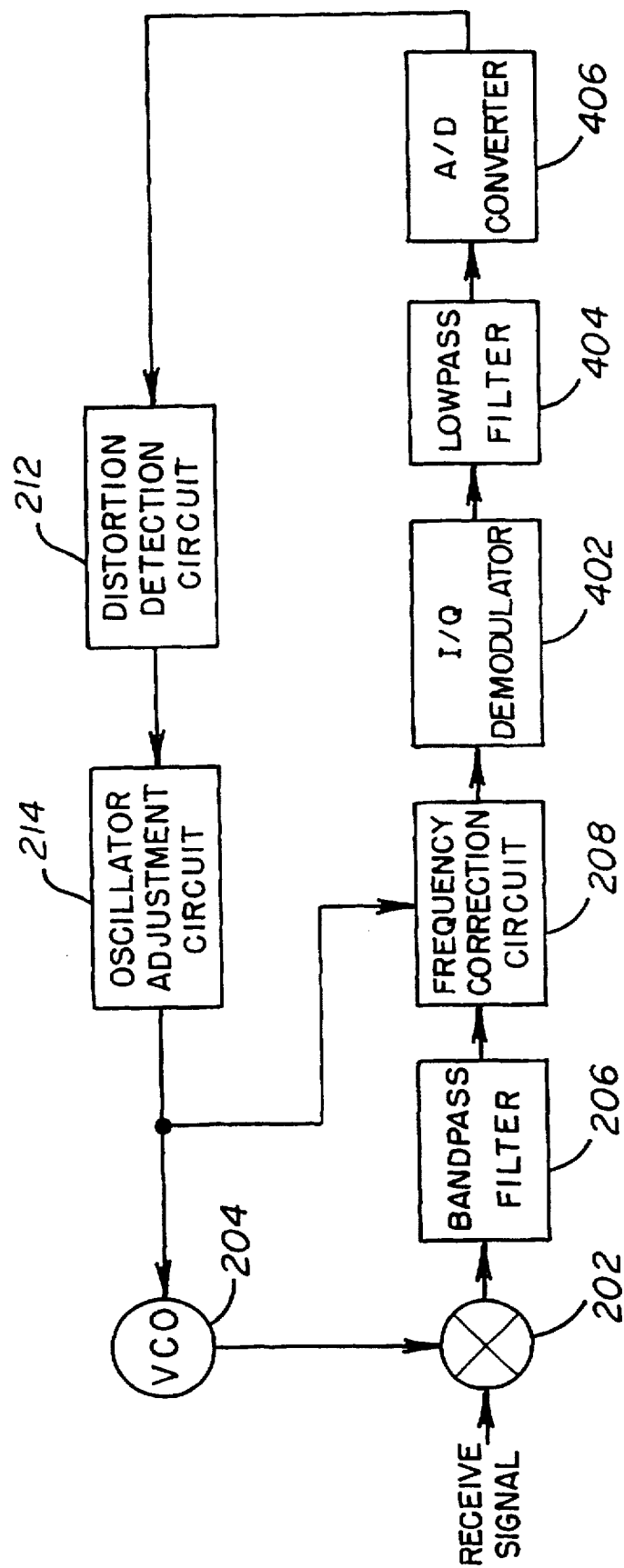
FIG. 4 is a block schematic diagram for circuitry of another embodiment of the invention.

For example, FIG. 4 is a schematic block diagram of another circuit design in accordance with the present invention. The circuit of FIG. 4 enables in-phase (I) and quadrature (Q) demodulation. In the design shown in FIG. 4, the limiter and sampler circuit 210 (FIG. 2) is replaced with an I/Q demodulator 402, a low pass filter 404, and an analog to digital (A/D) convertor 406. In the embodiment of FIG. 4, the output from the bandpass filter 206 is converted to a baseband signal through the I/Q demodulator 402. The I/Q demodulator converts the output of the bandpass filter 206 to a baseband signal using in-phase (I) and quadrature (Q) demodulation. The baseband signal is output from the I/Q demodulator 402 to the low pass filter 404. The low pass filter 404 is output to the A/D convertor 406 which converts the baseband signal to a digital signal. The digital output from the A/D convertor 406 is output to the distortion detection unit 212. The remaining components shown in FIG. 4 are similar to those shown in FIG. 2, and are identified using similar reference numbers and operate as discussed previously with reference to FIG. 2.

It is to be understood that the preceding embodiments, described above and as shown in the accompanying Figures, may be varied within the scope and spirit of the present invention. Because many embodiments of the present invention are possible within the scope of the present invention, it is to be construed that the present invention is not limited to the specific embodiments of the invention, which are exemplary. Accordingly, the scope of the invention should be construed in light of the appended claims and any equivalents thereof.

What is claimed is:

1. A receiver including a filter connected to an output of a mixer, the mixer receiving an RF signal and a a local oscillator (LO) signal, the LO signal being provided from a voltage controlled oscillator (VCO), the receiver further including noise suppression circuitry comprising:

a distortion detection circuit for estimating distortion from a signal output from the filter to provide an error signal to a voltage control input of the VCO, wherein the error signal from the distortion detection circuit includes first frequency shift errors determined from a first group of digital values in the signal output from the filter, and second frequency shift error signals having a negative value relative to the first frequency shift errors, the second frequency shift error signals being determined from a second group of digital values in the signal output from the filter.

2. The receiver of claim 1 further comprising:

an oscillator adjustment circuit for receiving the error signal from the distortion detection circuit and integrating the error signal to provide a signal to the voltage control input of the VCO.

3. The receiver of claim 2 wherein the oscillator adjustment circuit is an infinite impulse response filter.

4. The receiver of claim 2 further providing a sleep mode signal indicating when lower power is to be utilized, wherein the oscillator adjustment circuit receives the sleep mode signal and maintains a state of the voltage control input of the VCO upon receipt of the sleep mode signal after the sleep mode signal is disabled.

5. A receiver including a filter connected to an output of a mixer, the mixer receiving an RF signal and a local oscillator (LO) signal, the LO signal being provided from a voltage controlled oscillator (VCO), the receiver further including noise suppression circuitry comprising:

a distortion detection circuit for estimating distortion from a signal output from the filter to provide an error signal to a voltage control input of the VCO; and a frequency correction circuit for coupling the signal output from the filter to the distortion detection circuit, the frequency correction circuit also receiving the error signal from the distortion detection circuit to enable the frequency correction circuit to remove frequency shift in the signal output from the filter created by the VCO.

6. The receiver of claim 1 wherein the first group of digital values are digital ones and the second group of digital values are digital zeros.

7. The receiver of claim 1 wherein the distortion detection circuit comprises:

a digital signal detection circuit having an input receiving the signal output from the filter, the digital signal detection circuit determining digital ones as the first group of digital values and digital zeros as the second group of digital values from a signal received from the signal output from the filter, the digital signal detection circuit providing a first output indicating a location of digital ones in the signal output from the filter and a second output indicating a location of digital zeros in the signal output from the filter;

a frequency discriminator having a first input receiving the signal output from the filter and a second input coupled to the output of a frequency reference, the frequency discriminator comparing a frequency of the signal output from the filter with a frequency of a signal output from the frequency reference, the frequency discriminator providing an output based on the comparison;

a first sampler having a first input coupled to the output of the frequency discriminator and a control input connected to the first output of the data detection circuit, the first sampler having an output providing a time sampled output for digital ones directly proportional to the signal from the frequency discriminator;

a first comparison circuit having an input connected to the output of the first sampler, and an output, the first comparison circuit providing a signal at its output indicating a frequency shift difference between digital ones received from the first sampler and a nominal value for digital ones;

a second sampler having a first input coupled to the output of the frequency discriminator and a control input connected to the second output of the data detection circuit, the second sampler having an output providing a time sampled output for digital zeros directly proportional to the signal from the frequency discriminator;

a second comparison circuit having an input connected to the output of the second sampler, and an output, the second comparison circuit providing a signal at its output indicating a frequency shift difference between digital zeros received from the second sampler and a nominal value for digital zeros;

an adder having a first input and a second input, the first input coupled to the output of the first comparison circuit and the second input coupled to the output of the second comparison circuit to receive the digital zeros signal with a negative value relative to the digital ones signal received at the first input, and an output providing a signal composed of its first input added to its second input.

8. The receiver of claim 7 wherein the distortion detection circuit further comprises:

a first multiplier having a first input to output path coupling the output of the first comparison circuit to the first input of the adder, and a second input connected to receive a first control signal; and a second multiplier having a first input to output path coupling the output of the second comparison circuit to the second input of the adder, and a second input connected to receive the inverse of the first control signal.

9. The receiver of claim 8 wherein the distortion detection circuit further comprises:

a first absolute value circuit having an input to output path coupling the output of the first comparison circuit to the input of the first multiplier, the first absolute value circuit providing an absolute value of a signal received at its input at its output; and a second absolute value circuit having an input to output path coupling the output of the second comparison circuit to the input of the second multiplier, the second absolute value circuit providing an absolute value of a signal received at its input at its output.

10. The receiver of claim 8 wherein the first control signal is the first output of the data detection circuit combined with the second output of the data detection circuit.

11. The receiver of claim 1, wherein the signal output from the filter is provided to the distortion detection circuit by a limiter and sampler, wherein sampling time is chosen to be centered between zero crossings of the signal from the output of the filter.

12. The receiver of claim 1, wherein the signal output from the filter is coupled to the distortion detection circuit by an in phase and quadrature demodulator connected in series with a low pass filter connected in series to an analog to digital converter.

13. A receiver including a filter connected to an output of a mixer, the mixer receiving an RF signal and a local oscillator (LO) signal, the LO signal being provided from a voltage controlled oscillator (VCO), the receiver further providing a sleep mode signal indicating when low power is to be utilized, the receiver further including noise suppression circuitry comprising:

a distortion detection circuit for estimating distortion from a signal output from the filter to provide an error signal to a voltage control input of the VCO; and an oscillator adjustment circuit which receives the error signal from the distortion detection circuit and the sleep mode signal, the oscillator adjustment circuit integrating the error signal to provide a signal to the voltage control input of the VCO; the oscillator adjustment circuit further maintaining the voltage control input state upon receipt of the sleep mode signal after the sleep mode signal is disabled.

14. A receiver having noise suppression circuitry comprising:

a voltage controlled oscillator (VCO) having a data input, a voltage control input and an output;

a mixer having a first input connected to the VCO output, a second input forming an input of the receiver, and an output;

a filter having an input connected to the output of the mixer and an output;

a distortion detection circuit having an input coupled to receive a signal from the output of the filter, and an output, the distortion detection circuit providing an error signal including first frequency shift errors determined from digital one values in the signal output from the filter, and second frequency shift error signals having negative values relative to the first frequency shift errors and being determined from a digital zero values in the signal output from the filter, the error signal being provided at the distortion detection circuit output;

an infinite impulse response filter having an input connected to the output of the distortion detection circuit to receive the error signal, and an output connected to the voltage control input of the VCO; and a frequency correction circuit coupling the output of the filter to the input of the distortion detection circuit, the frequency correction circuit further receiving the output of the distortion detection circuit and removing a frequency shift in the signal from the filter output created by the control input to the VCO.

15. The receiver of claim 14, wherein the receiver provides a sleep mode signal indicating when low power is to be utilized, and wherein the infinite impulse response filter receives the sleep mode signal and maintains a signal state at its output based upon the output of the distortion detection circuit upon receipt of the sleep mode signal after the sleep mode signal is disabled.

16. The receiver having noise suppression circuitry as claimed in claim 14 wherein the distortion detection circuit comprises:

a digital signal detection circuit having an input coupled to the output of the frequency correction circuit, the digital signal detection circuit determining digital ones and digital zeros from a signal received from the output of the frequency correction circuit, the digital signal detection circuit having a first output indicating a location of digital ones in the signal output from the frequency correction circuit and having a second output indicating a location of digital zeros in the signal output from the frequency correction circuit;

a frequency discriminator having a first input coupled to the output of the frequency correction circuit and a second input coupled to the output of a frequency reference, the frequency discriminator comparing a frequency of a signal from the output of the frequency reference with a frequency of a signal output from the VCO, the frequency discriminator providing an output based on the comparison;

a first sampler having a first input coupled to the output of the frequency discriminator and a control input connected to the first output of the data detection circuit, the first sampler having an output providing a time sampled output for digital ones directly proportional to the signal from the frequency discriminator;

a first comparison circuit having an input connected to the output of the first sampler, and an output, the first comparison circuit providing a signal at its output indicating a frequency shift difference between digital ones received from the first sampler and a nominal value for digital ones;

a first absolute value circuit having an input connected to the output of the first comparison circuit and an output, the first absolute value circuit providing an absolute value of a signal received at its input at its output;

a first multiplier having a first input connected to the output of the first absolute value circuit, an output and a second input connected to receive a first control signal;

a second sampler having a first input coupled to the output of frequency discriminator and a control input connected to the second output of the data detection circuit, the second sampler having an output providing a time sampled output for digital zeros directly proportional to the signal from the frequency discriminator;

a second comparison circuit having an input connected to the output of the second sampler, and an output, the second comparison circuit providing a signal at its output indicating a frequency shift difference between digital zeros received from the second sampler and a nominal value for digital zeros;

a second absolute value circuit having an input connected to the output of the second comparison circuit and an output, the second absolute value circuit providing an absolute value of a signal received at its input at its output;

a second multiplier having a first input connected to the output of the second absolute value circuit, an output, and a second input connected to receive the inverse of the first control signal and an adder having a first input connected to the output of the first multiplier, a second input connected to the output of the second multiplier, and an output coupled to the input of the VCO.

17. A method for reducing noise in a receiver comprising the steps of:

receiving an RF signal;

generating an IF signal from the RF signal;

filtering the IF signal;

estimating distortion in the IF signal;

feeding back the distortion estimate in order to suppress noise and out-of-band signals from the filtered IF signal; and maintaining a state of the distortion estimate upon receipt of a sleep mode signal until after the sleep mode signal is disabled.

18. A method for reducing noise in a receiver comprising the steps of:

receiving an RF signal:

generating an IF signal from the RF signal;

filtering the IF signal:

estimating distortion in the IF signal by:

generating first error signals including first frequency shift errors determined from a first group of digital values in the filtered IF signal; and generating second error signals including second frequency shift error signals having negative values relative to the first frequency shift errors and being determined from a second group of digital values in the filtered IF signal; and feeding back the distortion estimate in order to suppress noise and out-of-band signals from the filtered IF signal.

19. The method of claim 18 wherein the first group of digital values are digital ones and the second group of digital values are digital zeros.

20. The method of claim 18 wherein the distortion estimate is fed back to a voltage control input of a VCO through an infinite impulse response filter.

21. A method for reducing noise in a receiver comprising the steps of:

receiving an RF signal, generating an IF signal from the RF signal;

filtering the IF signal:

estimating distortion in the IF signal;

feeding back the distortion estimate in order to suppress noise and out-of-band signals from the filtered IF signal; and removing frequency shift from the filtered IF signal created by the fed back distortion estimate.

22. The method of claim 19, wherein the step of generating the first error signals comprises the steps of:

isolating digital ones in the filtered IF signal;

comparing the isolated digital ones to a nominal value for a digital one to provide a ones frequency shift difference signal; and taking the absolute value of the ones frequency shift difference signal to provide the first error signals, and wherein the step of generating the second error signals comprises the steps of:

isolating digital zeros in the filtered IF signal;

comparing the isolated digital zeros to a nominal value for a digital zero to provide a zeros frequency shift difference signal; and taking the absolute value of the zeros frequency shift difference signal to provide the second error signals.

23. The method of claim 22, wherein the step of feeding back the distortion estimate comprises the steps of:

providing the first error signals through an inverter to a first input of an adder;

providing the second error signals to a second input of the adder; and providing the output of the adder through an infinite impulse response filter to a voltage input of a VCO.

* * * * *